United States Patent [19]
Caravella et al.

[11] Patent Number: 5,754,010
[45] Date of Patent: May 19, 1998

[54] MEMORY CIRCUIT AND METHOD FOR SENSING DATA

[75] Inventors: James S. Caravella, Chandler; David F. Mietus, Phoenix; Jeremy W. Moore, Chandler, all of Ariz.

[73] Assignee: Motorola, Inc., Schaumburg, Ill.

[21] Appl. No.: 859,963

[22] Filed: May 21, 1997

[51] Int. Cl.⁶ .................................................. G11C 7/00
[52] U.S. Cl. ................ 365/203; 365/189.02; 365/189.09
[58] Field of Search ........................... 365/203, 189.02, 365/189.06, 189.07, 189.09, 189.11

[56] References Cited

U.S. PATENT DOCUMENTS

| | | | |
|---|---|---|---|
| 5,467,312 | 11/1995 | Albon et al. | 365/189.01 |
| 5,557,568 | 9/1996 | Miyamoto et al. | 365/185.22 |
| 5,671,186 | 9/1997 | Igura | 365/203 |
| 5,675,539 | 10/1997 | Mirabel et al. | 365/185.25 |
| 5,694,362 | 12/1997 | Zhang et al. | 365/203 |

*Primary Examiner*—Son T. Dinh
*Attorney, Agent, or Firm*—Robert D. Atkins

[57] ABSTRACT

A memory circuit (24) includes a sense amp circuit (30) that uses multiplexers (86) in a column mux (32) for pre-charging only selected bitlines in order to limit the current during a read operation of the FLASH memory circuit (24). The sense amp circuit (30) provides the bitline with a pre-charge voltage that is set by a current reference (68) that is substantially supply independent. In the read mode the sense amp circuit (30) responds to either a voltage on the bitline that is lowered from the pre-charge voltage value by a selected programmed memory cell (40) or by a voltage that remains at the pre-charged voltage value for an unprogrammed memory cell.

20 Claims, 3 Drawing Sheets

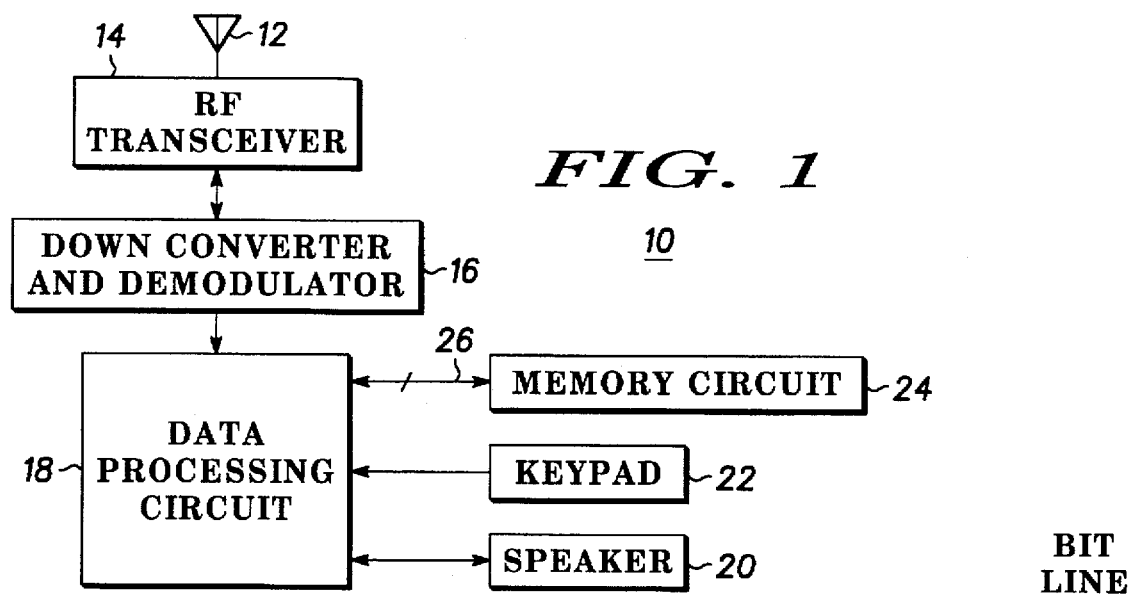
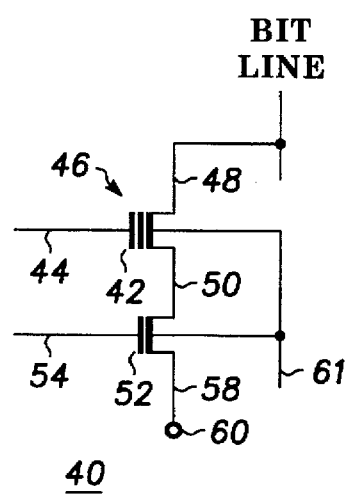
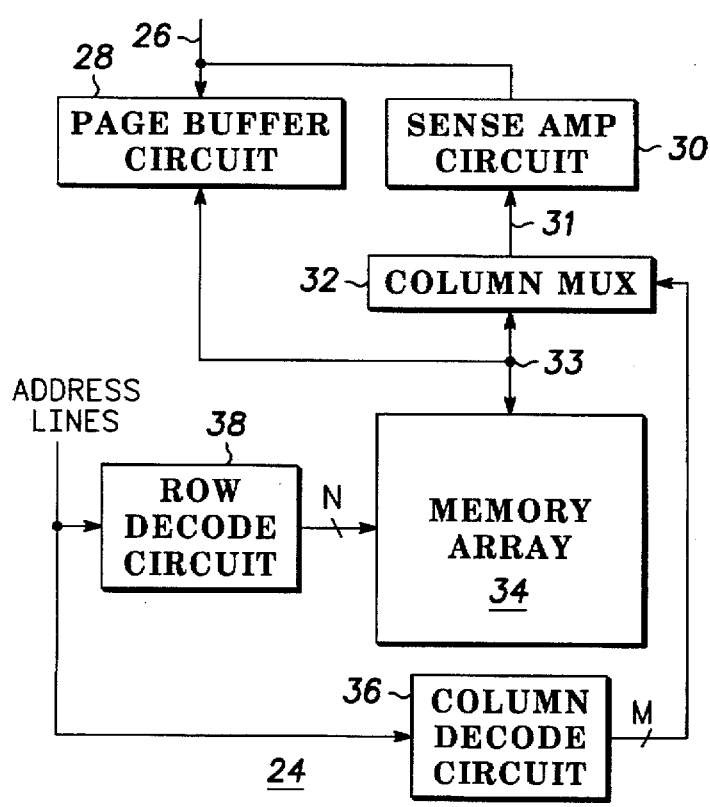

MEMORY CIRCUIT AND METHOD FOR SENSING DATA

BACKGROUND OF THE INVENTION

The present invention relates, in general, to integrated circuits and, more particularly, to memory circuits.

A portable wireless system such as a cellular phone, two-way radio, or a pager uses analog circuitry to convert signals between frequencies ranging from radio frequency (RF) to base band. Received RF signals are converted to base-band signals through circuits such as an RF transceiver, a down converter, and a demodulator. For a cellular phone the converted base-band signals are processed into recognizable speech in the voice band frequencies. A digital signal processor (DSP) uses data stored in a static random access memory (SRAM) and a FLASH memory to process the base-band signals.

The FLASH memory, such as an array of floating gate non-volatile memory cells, is used to store software program instructions used by the DSP. The high density FLASH memory needs to be easily programmed or "written" and, as the occasion arises, to reprogram ("erase" and "rewrite") the device in the field. The floating gate of a transistor in the non-volatile memory cell traps a charge when the transistor is programmed. The trapped charge modifies a threshold voltage of the transistor in the memory cell.

The array of memory cells in the FLASH memory is configured into rows and columns with a bitline connecting the memory cells located in each column. When a selected bit cell is "read", the threshold voltage of a programmed memory cell is lower than the threshold voltage of an unprogrammed memory cell. The threshold voltage of the transistor in the selected memory cell determines the current that the memory cell can sink.

The bitline is typically pre-charged to a voltage value prior to the memory cell being "read". In the read mode the memory cell is selected and the sense amp detects whether the voltage on the BITLINE is lowered by the programmed memory cell or the voltage on the BITLINE remains at the pre-charged voltage value for an unprogrammed memory cell. Thus, a buffered output of the sense amp in a FLASH memory provides a logic value that corresponds to the selection of either a programmed memory cell or an unprogrammed memory cell.

Pre-charging the numerous bitlines in the memory array prior to a "read" operation draws a large current from a portable battery for charging the capacitive load on each bitline. In addition, the time for a read operation that retrieves the data programmed into a memory cell depends on the pre-charge bitline voltage value, fluctuations in the voltage supplied by the battery, and the response of the sense amp to detect changes in the bitline voltage value.

Accordingly, it would be advantageous to have a sense amp and pre-charge circuit that limits the current during the pre-charge of the bitlines in the memory array and provides a fast response during a read operation to the data programmed into a memory cell.

BRIEF DESCRIPTION OF THE DRAWINGS

FIG. 1 is a block diagram of a wireless communications device;

FIG. 2 is a block diagram of a non-volatile memory in the wireless communications device;

FIG. 3 is a schematic diagram of a memory cell in the memory circuit;

DETAILED DESCRIPTION OF THE PREFERRED EMBODIMENT

Figure 4:
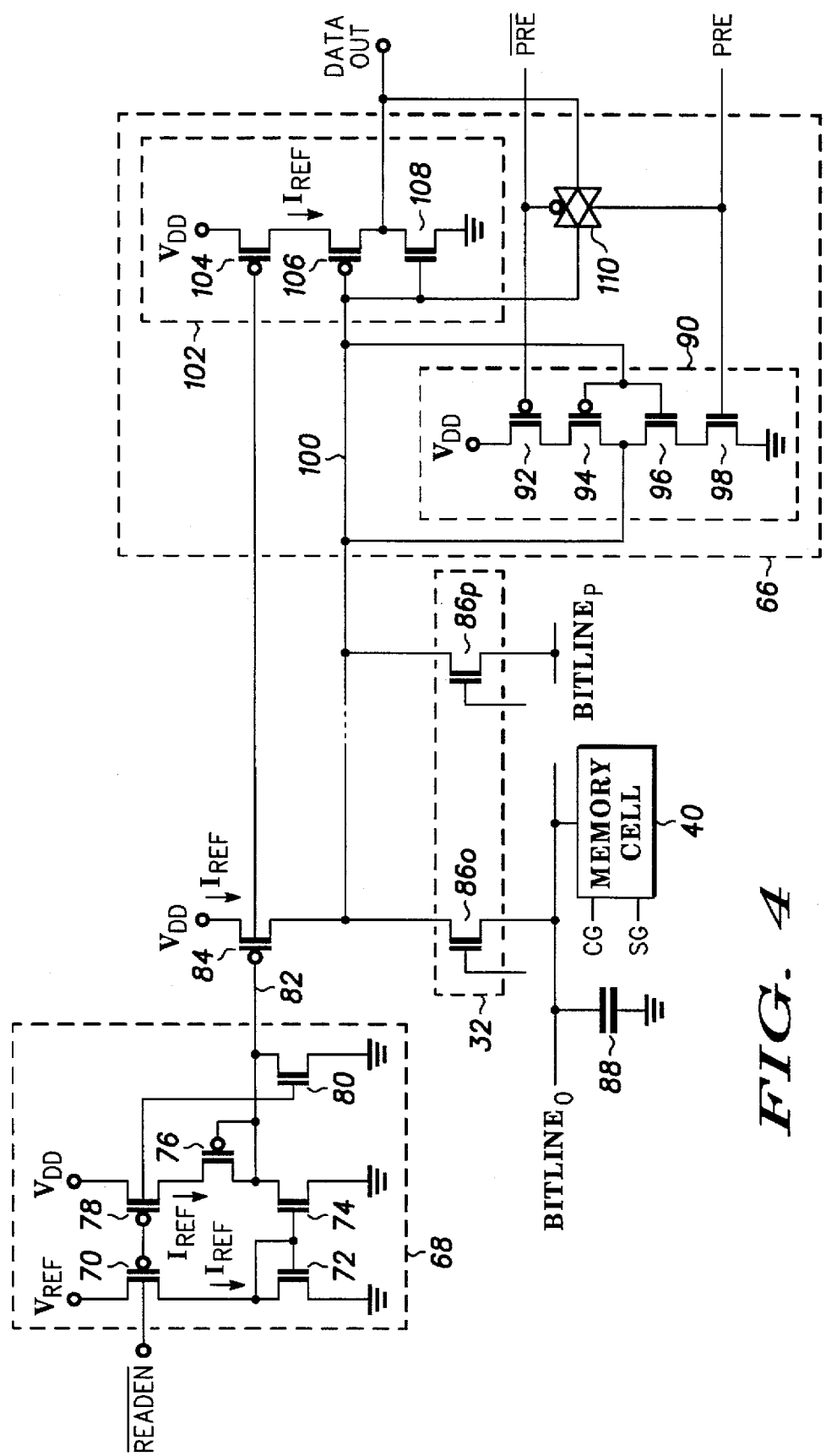
FIG. 4 is a schematic diagram showing portions of a reference current generator, a sense amp circuit, a column mux, and a memory cell.

Generally, the present invention provides a sense amp that selects the bitlines for pre-charging in order to limit the current during a read operation of a FLASH memory array. In addition, the sense amp provides the bitline with a pre-charge current that is set by a current reference that is substantially supply independent. In the read mode the sense amp responds to either a voltage on the bitline that is lowered from the pre-charge voltage value by a selected programmed memory cell or by a voltage that remains at the pre-charged voltage value for an unprogrammed memory cell.

FIG. 1 is a block diagram of a wireless communication device 10 such as a cellular telephone, two-way radio, or pager. Wireless communication device 10 includes an antenna 12, an RF transceiver 14 (transmitter circuit and a receiver circuit), a down converter and demodulator circuit 16, a data processing circuit 18, a speaker 20, a keypad 22, and a memory circuit 24. Antenna 12 receives a transmitted radio frequency carrier signal modulated with digital information. RF transceiver 14 amplifies the RF carrier signal and converts the frequency down to an intermediate frequency (IF) signal which is coupled to an input of a down converter and demodulator circuit 16. It should be noted that RF transceiver 14 is also referred to as a translator that is coupled for receiving a transmitted signal. Down converter and demodulator circuit 16 extracts the digital information from the IF signal to produce baseband digital data which is coupled to an input of a data processing circuit 18. Data processing circuit 18 operates under the control of software program instructions that are stored in a nonvolatile FLASH memory in memory circuit 24. Data processing circuit 18 has an input that receives data from keypad 22 and an output that produces audio signals for driving speaker 20.

FIG. 2 is a block diagram of memory circuit 24. FLASH memory circuit 24 is initially erased and memory cells that are to be programmed with a logic one data value are written. Page buffer circuit 28 is coupled for receiving input signals via bus 26. Page buffer circuit 28 is connected to sense amp circuit 30 via a bus 26. Sense amp circuit 30 has a data bus 31 that connects to a column mux 32. Column mux 32 has control inputs that are coupled for receiving address signals and allows data to be read from selected BITLINEs in memory array 34. Column decode circuit 36 receives address lines from the address bus and decodes the address lines for selecting a column of memory cells in column mux 32. Row decode circuit 38 receives address lines from the address bus and decodes the address lines for selecting a row of memory cells within memory array 34. It should be noted that the number of lines for buses 26, 31, and 33 is not a limitation of the present invention.

FIG. 3 is a block diagram of a memory cell 40. Memory cell 40 is also referred to as a bit cell. Briefly referring to FIG. 2, multiple instances of memory cell 40 are configured into an array and arranged in rows and columns of memory array 34. Memory cell 40 is a two-transistor memory cell that includes a control transistor 42 and a select transistor 52. Control transistor 42 has a gate terminal 44, a gate structure 46, a drain region 48, and a source region 50. Select transistor 52 has a gate terminal 54, a drain region 50, and a source region 58. The gate terminal is also referred to as a control terminal and connections made to the drain and source regions are referred to as conduction terminals. In particular, drain region 48 of control transistor 42 serves as an output of memory cell 40 that either receives or generates a signal, BITLINE. The source region of control transistor 42 is commonly connected to the drain region of select transistor 52 and is referred to by the reference number 50. Source region 58 of select transistor 52 is connected to a power supply conductor 60. Both drain region 48 and source region 50 of control transistor 42 and both drain region 50 and source region 58 of select transistor 52 are disposed in a well region that is contacted by well terminal 61. Select transistor 52 is shown connected to the source of control transistor 42 and is referred to as a source selected memory architecture. However, the type of memory architecture is not a limitation of the present invention. In other words, the memory cell could be a one-transistor memory cell architecture.

It should be noted that control transistor 42 is shown as a floating gate transistor. In other words, control transistor 42 is a non-volatile memory storage transistor that traps charge on a floating gate, i.e., a gate material that is separate and isolated from the gate terminal. It should be further noted that control transistor 42 and select transistor 52 are shown as N-channel metal oxide semiconductor field effect transistors (MOSFETs). However, the type of transistor is not a limitation of the present invention.

In operation, memory cell 40 stores digital data in a PROGRAM mode, reads stored digital data in a READ mode, and erases stored digital data in an ERASE mode. Gate terminals 44 and 54 of memory cell 40 are referred to as a control terminal and a select gate, respectively. Power supply conductor 60 is referred to as a SOURCE TERMINAL.

The TABLE below lists the voltage values that are applied to the control terminal, the select gate, the SOURCE TERMINAL, and the WELL TERMINAL of memory cell 40 when operating in the READ mode, the PROGRAM mode, and the ERASE mode. In addition, a voltage value is also supplied as the BITLINE signal in the PROGRAM mode. By way of example, the value stored in memory cell 40 is output as the BITLINE signal in the READ mode when the select gate voltage transitions from about 0 volts to about VDD, and the control terminal and SOURCE TERMINAL have voltage values of about +1.2 volts and about 0 volts, respectively.

Alternatively, a value is stored in memory cell 40 in the PROGRAM mode when the respective voltage values of about −9 volts and about 0 volts are supplied to the control terminal and to the SOURCE TERMINAL. The voltage value on the gate terminal of select transistor 52 is any voltage within the range of VDD to ground. Memory cell 40 is programmed when the BITLINE signal has a value of about +5.5 volts and remains unchanged when the BITLINE signal has a value of about 0 volts. The letter X in the table represents a don't care voltage value.

| MODE | BITLINE SIGNAL | CONTROL TERMINAL VOLTAGE | SELECT GATE VOLTAGE | SOURCE TERMINAL VOLTAGE | WELL TERMINAL VOLTAGE |
| --- | --- | --- | --- | --- | --- |
| READ | output | +1.2 V | 0 V/VDD | 0 V | 0 V |
| PROGRAM | +5.5 V | −9 V | X | 0 V | 0 V |
| ERASE | floats | +13 V | 0 V | −5 V | −5 V |

The logic value stored in memory cell 40 is cleared in the ERASE mode when the select gate voltage is about zero volts, and the respective voltage values of about +13 volts and about −5 volts are supplied to the control terminal and to the SOURCE TERMINAL.

FIG. 4 is a schematic diagram showing portions of a reference current generator 68, a sense amp circuit 66, a column mux 32, and a memory cell 40 (FIG. 2). It should be noted that the same reference numbers are used in the figures to denote the same elements. Reference current generator 68 generates a voltage $V_{GS}$ at output terminal 82 during a read operation. The voltage $V_{GS}$ is also referred to as a reference signal. In a read operation an input signal $\overline{READEN}$ has a logic zero value that causes P-channel MOSFET 70 to be conductive. The source terminal of MOSFET 70 is connected to a power supply conductor that is coupled for receiving a voltage $V_{REF}$, where $V_{REF}$ is a bandgap voltage reference having a value of about 1.2 volts. A gate of MOSFET 70 is sized to have a width $W_{70}$ and a length $L_{70}$ and conduct a current $I_{REF}$ that is proportional to the ratio of $(W_{70}/L_{70})$. The current $I_{REF}$ is substantially supply voltage independent. In other words, the current $I_{REF}$ is not dependent on a supply voltage $V_{DD}$ that fluctuates during system operation but rather on the stable bandgap voltage reference $V_{REF}$.

N-channel MOSFETs 72 and 74 are configured to operate as a current mirror such that both MOSFETs 72 and 74 conduct similar currents Of $I_{REF}$. The current $I_{REF}$ in MOSFET 74 is also conducted through P-channel MOSFETs 76 and 78. Fluctuations or changes in the supply voltage $V_{DD}$ have no substantial effect on the value for the current $I_{REF}$, but changes in the supply voltage $V_{DD}$ do change the voltage $V_{GS}$ that is generated at output terminal 82. By way of example, the voltage $V_{GS}$ at output terminal 82 during a read operation has a voltage value of about 600 milivolts when the power supply conductor $V_{DD}$ has a voltage of about 1.8 volts. A transistor 80 holds the voltage $V_{GS}$ at about zero volts when not in a read operation.

The BITLINE that connects a column of memory cells in memory array 34 to column mux 32 (FIG. 2) is pre-charged for about twenty nanoseconds prior to a read operation. A capacitor 88 having a value such as, for example, 2 picofarads (PF) is charged during the pre-charge time to a voltage value as determined by an inverting circuit 102. Capacitor 88 is the sum of junction capacitance values for drain regions of each memory cell 40 connected to the BITLINE.

Inverting circuit 102 is biased into an active region by complementary metal oxide semiconductor (CMOS) transmission gate 110 during the pre-charge time. Transmission gate 110 has a conduction terminal connected to an input of inverting circuit 102 and the other conduction terminal connected to an output of inverting circuit 102. A control input of transmission gate 110 is coupled for receiving a pre-charge control signal PRE and a complement pre-charge control input that receives an inverted pre-charge control signal $\overline{PRE}$. During the pre-charge time, transmission gate 110 is conducting and provides an electrical path that connects the input to the output of inverting circuit 102. In other words, the voltage at the input to inverting circuit 102 is substantially the same as the voltage at the output of inverting circuit 102, i.e., inverting circuit 102 is biased in an active region. By way of example, the voltage at node 100 is about 0.9 volt when $V_{DD}$ is about 1.8 volts.

In the active region, P-channel MOSFETs 104 and 106, and N-channel MOSFET 108 are biased to be conductive. A gate terminal of MOSFET 104 receives the voltage $V_{GS}$ from reference current generator 68 that sets a current $I_{REF}$ that is conducted in both MOSFET 104 and MOSFET 106. Thus, the voltage $V_{GS}$ that is used to generate the current $I_{REF}$, i.e., a current that is relatively independent of the voltage $V_{DD}$, also keeps the voltage at node 100 relatively independent of the voltage $V_{DD}$.

The gate terminals of MOSFETs 92 and 98 receive the respective signals, $\overline{PRE}$ and PRE, to activate a pre-charge circuit 90 during the pre-charge time. Pre-charge circuit 90 has an input that connects the gate terminals of P-channel MOSFET 94 and N-channel MOSFET 96 to the input of inverting circuit 102. The input of pre-charge circuit 90 receives the bias voltage from inverting circuit 102. An output of pre-charge circuit 90 is connected to node 100 for maintaining the output at substantially the bias voltage. In other words, pre-charge circuit 90 does not alter the bias voltage as set by inverting circuit 102, but rather MOSFETs 92, 94, 96, and 98 are sized such that the pre-charge current is larger than the current $I_{REF}$ and charges capacitor 88 during the pre-charge time.

The bias voltage at node 100 is coupled to the $BITLINE_0$ through a multiplexer (mux) $86_0$ and to the $BITLINE_P$ through a multiplexer $86_P$, where P is an integer number. Only one in the group of multiplexers $86_P$–$86_0$ is selected to be conductive at any given time. Thus, column mux 32 (FIG. 2) has a plurality of multiplexers that are individually selected by a decoding of the address lines in column decode circuit 36. By way of example, seven address lines would provide a value for P that is equal to 128 for selecting one multiplexer from the group of 128 multiplexers. The commonly connected source terminals of the group of multiplexer serve as node 100. For instance, with only one multiplexer $86_0$ being selected, inverting circuit 102 sets a voltage at node 100 and pre-charge circuit 90 provides a pre-charge current to charge $BITLINE_0$. On the other hand, with only multiplexer $86_P$ being selected, inverting circuit 102 sets a voltage at node 100 and pre-charge circuit 90 provides a pre-charge current to charge $BITLINE_P$. Only the capacitance on the selected BITLINE is charged to the voltage of, by way of example, 0.9 volts during the pre-charge time.

Following the pre-charge time transmission gate 110 become nonconductive and pre-charge circuit 90 becomes inactive. The current $I_{REF}$ generated by the voltage $V_{GS}$ at the control terminal of P-channel MOSFET 84 flows through the selected multiplexer to a selected memory cell. For instance, when multiplexer $86_0$ is selected, the current $I_{REF}$ flows to memory cell 40 connected to $BITLINE_0$.

In the read mode, control gate (CG) 44 (FIG. 3) is biased to a voltage of about 1.2 volts and select gate (SG) 54 has a voltage of about $V_{DD}$. In accordance with the charge trapped on the floating gate of memory cell 40, a portion of the current $I_{REF}$ on the $BITLINE_0$ flows to power supply conductor 60. When only a small portion of the current $I_{REF}$ flows in control transistor 42 and select transistor 52 of memory cell 40A, the current $I_{REF}$ will charge the capacitance associated with node 100 and capacitor 88 to a voltage value higher than the pre-charge voltage on node 100 of about 0.9 volt. On the other hand, when substantially all of the current $I_{REF}$ is sunk by memory cell 40 the voltage value on node 100 is pulled lower than the pre-charge voltage of about 0.9 volt. In the read mode following the pre-charge time, inverting circuit 102 remains biased in the active region and responds to memory cell 40 either moving the voltage at node 100 above or below the pre-charge voltage value. When node 100 has a voltage value that is above the pre-charge voltage, the signal DATA OUT has a logic zero value. When node 100 has a voltage value that is below the pre-charge voltage, the signal DATA OUT has a logic one value. It should be noted that the pre-charge voltage value at node 100 centered in a range between $V_{DD}$ and ground allows inverting circuit 102 to equally respond to either a high or low going voltage at node 100 following the pre-charge time.

Thus, data stored in bit cell 40 of memory circuit 24 is read by sourcing a current from inverting circuit 102 into a bitline of memory circuit 40 to bias the bitline to a pre-charge voltage. Another current from pre-charge circuit 90 is sourced into the bitline in response to the pre-charge voltage established by inverting circuit 102, where the current from pre-charge circuit 90 is larger than the current from inverting circuit 102 to charge the bitline to a pre-charge value during a pre-charge time. A reference current is compared with the bit cell current following the pre-charge time, where the bit cell current is representative of the data stored in bit cell 40. The pre-charge voltage on the bitline is altered based on the comparison between the reference current and the bit cell current to develop a logic state on the bitline representative of the data stored in bit cell 40.

Figure 5:
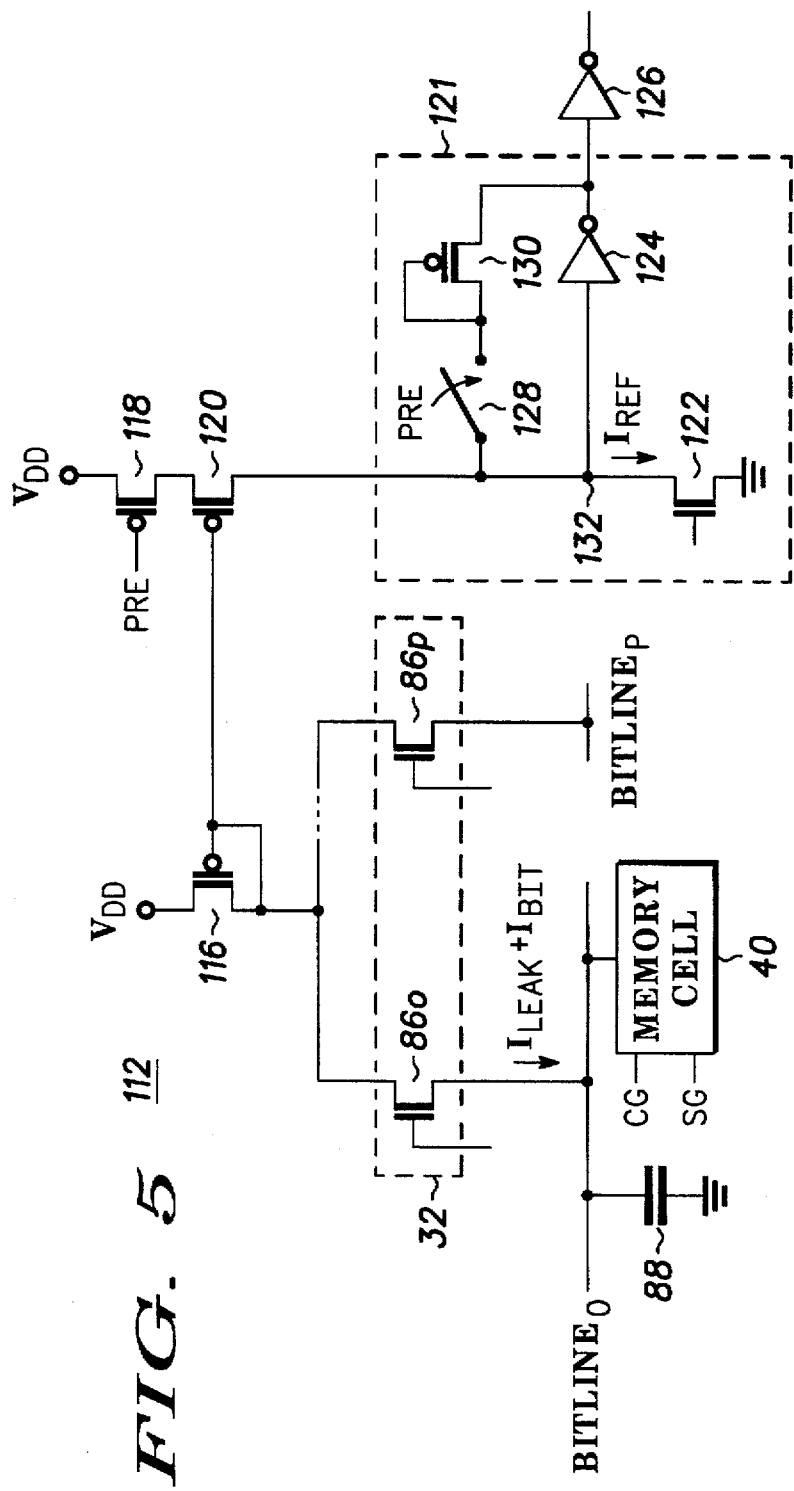
FIG. 5 is a schematic diagram of an alternate embodiment of a sense amp circuit.

FIG. 5 is a schematic diagram of an alternate embodiment of a sense amp circuit 112. The voltage on the BITLINE is set by a pre-charge voltage prior to a read operation. During a pre-charge time the signal PRE is a logic one and switch 128 is closed and a P-channel MOSFET 118 is nonconducting. MOSFET 118 is an isolation circuit that allows a pre-charge voltage circuit 121 to operate separately from memory cell 40 during the pre-charge time. Switch 128 could be either an N-channel coupler or a CMOS transmission gate. An inverter 124 includes an N-channel and a P-channel MOSFET (not shown). Pre-charge voltage circuit 121 includes the closure of switch 128 to allow the current from the P-channel MOSFET of inverter 124 to flow through a P-channel MOSFET 130 and switch 128 to N-channel MOSFET 122. Pre-charge voltage circuit 121 establishes a pre-charge voltage at a node 132. A gate terminal of MOSFET 122 receives a voltage that is set by a bandgap voltage reference circuit (not shown) such that the current $I_{REF}$ is relatively independent of voltage fluctuation to the power supply conductor $V_{DD}$. Thus, the P-channel MOSFET of inverter 124 and MOSFET 130 conduct a stable current $I_{REF}$ during the pre-charge time and the transistors are sized to provide a voltage at node 132 of about 0.4 volt.

Following the pre-charge time, the signal PRE is a logic zero value that opens switch 128 and causes MOSFET 118 to be conductive. When mux $86_O$ is selected a current flows through P-channel MOSFET 116 and a multiplexer (mux) $86_O$ to the $BITLINE_O$. Likewise, when mux $86_P$ is selected a current flows through P-channel MOSFET 116 and a multiplexer (mux) $86_P$ to the $BITLINE_P$. Only one in the group of multiplexers $86_P$–$86_O$ is selected to be conductive at any given time. Thus, column mux 32 (FIG. 2) has a plurality of multiplexers that are individually selected by a decoding of the address lines in column decode circuit 36.

The current ($I_{LEAK}+I_{BIT}$) flows through P-channel MOSFET 116 and multiplexer (mux) $86_O$. The current $I_{LEAK}$ is the leakage current for both the non-conducting MOSFETs and the PN-junction diodes that are connected to the BITLINE. The current $I_{BIT}$ is the current that memory cell 40 sinks when that cell is selected. The current $I_{BIT}$ has a value in accordance with the charge trapped on the gate of control transistor 42.

MOSFETs 116 and 120 are configured as a current mirror such that the current in MOSFET 120 is proportional to the current in MOSFET 116, i.e., a current of ($I_{LEAK}+I_{BIT}$). By way of example, the current in MOSFET 120 is K times the current flowing in MOSFET 116, where K is a value of about 2.5. Thus, when the current $I_{BIT}$ has a value of about zero for memory cell 40 that has been erased, only a small current flows in MOSFET 120. MOSFET 122 sinks the small current from MOSFET 120 and pulls the pre-charge voltage of 0.4 volt to about zero volts. The output of inverter 124 has a logic one value and the output of inverter 126 has a logic zero value. By pre-charging node 132 to a voltage of only 0.4 volt, MOSFET 122 that is sized to generate the current $I_{REF}$, i.e., a relatively small current, can discharge node 100. Thus, a pre-charge voltage circuit having an input coupled for receiving the current for comparison with a reference current provides an output signal of the memory circuit representative of the data stored in the bit cell.

When the current $I_{BIT}$ has a value that is substantially equal to the current $I_{REF}$ for a programmed memory cell 40, a current greater than K times $I_{REF}$ flows in MOSFET 120. MOSFET 122 can not sink the large current from MOSFET 120 and node 132 is pulled above the pre-charge voltage of 0.4 volt. The output of inverter 124 has a logic zero value and the output of inverter 126 has a logic one value. By pre-charging node 132 to a voltage of only 0.4 volt, MOSFET 120 that is sized to conduct a current larger than $I_{REF}$ can charge node 100. It should be noted that glitches in the current caused by switching semiconductor devices either on or off are lower in magnitude when compared with the currents for either $I_{REF}$ or $I_{BIT}$.

By now it should be appreciated that a sense amp and pre-charge circuit have been provided that limit the current during the pre-charge of the bitlines in the memory array during a read operation. In addition, the present invention for the sense amp provides a fast response to the data programmed into a FLASH memory cell during the read operation.

We claim:

1. A memory circuit, comprising:
   a bit cell for storing data and having a terminal coupled to a bitline; and
   a pre-charge circuit having an input coupled to a node for receiving a bias voltage and having an output coupled to the node for maintaining the output of the pre-charge circuit substantially at the bias voltage, where the pre-charge circuit provides a pre-charge current to the bitline during a pre-charge time.

2. The memory circuit of claim 1, further including:
   an inverting circuit having an input coupled to the node; and
   a transmission gate having a first conduction terminal coupled to an output of the inverting circuit, a second conduction terminal coupled to the node, and a control input coupled for receiving a pre-charge control signal.

3. The memory circuit of claim 2, wherein the inverting circuit includes:
   a first transistor having a first conduction terminal coupled to a first power supply conductor, and a control terminal coupled for receiving a reference signal;
   a second transistor having a first conduction terminal coupled to a second conduction terminal of the first transistor, a second conduction terminal coupled to the output of the inverting circuit, and a control terminal coupled to the node; and
   a third transistor having a first conduction terminal coupled to the second conduction terminal of the second transistor, a second conduction terminal coupled to a second power supply conductor, and a control terminal coupled to the node.

4. The memory circuit of claim 1, wherein the pre-charge circuit includes:
   a first transistor having a first conduction terminal coupled to a first power supply conductor, and a control terminal coupled for receiving a pre-charge control signal;
   a second transistor having a first conduction terminal coupled to a second conduction terminal of the first transistor, a second conduction terminal coupled to the output of the pre-charge circuit, and a control terminal coupled to the node;
   a third transistor having a first conduction terminal coupled to the second conduction terminal of the second transistor, and a control terminal coupled to the node; and
   a fourth transistor having a first conduction terminal coupled to the second conduction terminal of the third transistor, a second conduction terminal coupled to a second power supply conductor, and a control terminal coupled for receiving an inverted pre-charge control signal.

5. The memory circuit of claim 1, further including a current source having an output coupled to the bitline for providing a reference current.

6. The memory circuit of claim 5, further including a first transistor having a first conduction terminal coupled to the output of the current source, a second conduction terminal coupled to the bitline, and a control terminal coupled for receiving a select control signal.

7. A wireless communication device, comprising:
   a receiver circuit having an input coupled for receiving a radio frequency carrier signal and an output for producing digital data;
   a digital processing circuit for processing the digital data and producing an output signal; and
   a memory circuit for storing and transferring data to the digital processing circuit, where the memory circuit includes,
   (a) a bit cell having an input connected to a bitline for receiving a reference current, and
   (b) a pre-charge circuit having an input coupled to a first node for receiving a bias voltage and having an output coupled to the first node for maintaining the output of the pre-charge circuit substantially at the bias voltage, where the pre-charge circuit provides a pre-charge current to the bitline during a pre-charge time.

8. The wireless communication device of claim 7, wherein the pre-charge circuit includes:

a first transistor having a first conduction terminal coupled to a first power supply conductor, and a control terminal coupled for receiving a pre-charge control signal;

a second transistor having a first conduction terminal coupled to a second conduction terminal of the first transistor, a second conduction terminal coupled to the output of the pre-charge circuit, and a control terminal coupled to the first node;

a third transistor having a first conduction terminal coupled to the second conduction terminal of the second transistor, and a control terminal coupled to the first node; and a fourth transistor having a first conduction terminal coupled to the second conduction terminal of the third transistor, a second conduction terminal coupled to a second power supply conductor, and a control terminal coupled for receiving an inverted pre-charge control signal.

9. The wireless communication device of claim 7, wherein the memory circuit further includes:

an inverting circuit having an input coupled to the first node; and a transmission gate having a first conduction terminal coupled to an output of the inverting circuit, a second conduction terminal coupled to the first node, and a control input coupled for receiving a pre-charge control signal.

10. The wireless communication device of claim 9, wherein the inverting circuit includes:

a first transistor having a first conduction terminal coupled to a first power supply conductor, and a control terminal coupled for receiving a reference signal;

a second transistor having a first conduction terminal coupled to a second conduction terminal of the first transistor, a second conduction terminal coupled to the output of the inverting circuit, and a control terminal coupled to the first node; and a third transistor having a first conduction terminal coupled to the second conduction terminal of the second transistor, a second conduction terminal coupled to a second power supply conductor, and a control terminal coupled to the first node.

11. A memory circuit, comprising:

a bit cell for storing data and having a terminal coupled to a bitline where the bit cell causes a first current to flow through the bitline;

a pre-charge voltage circuit having an input coupled for receiving the first current for comparison with a reference current to provide an output signal of the memory circuit representative of the data stored in the bit cell; and an isolation circuit coupled between the bitline and the input of the pre-charge voltage circuit to disable the first current during a pre-charge time to allow the pre-charge circuit to establish a bias voltage at its input.

12. The memory circuit of claim 11 wherein the isolation circuit includes:

a current mirror having an input coupled to the bitline and an output coupled to the input of the pre-charge circuit where the current mirror is disabled during the pre-charge time.

13. The memory circuit of claim 12 wherein the current mirror includes:

a first transistor having a control terminal and a first conduction terminal commonly coupled to the bitline;

a second transistor having a first conduction terminal coupled to a second conduction terminal of the first transistor, a control terminal coupled to the control terminal of the first transistor, and a second conduction terminal coupled to the input of the pre-charge voltage circuit; and a third transistor having a control terminal coupled for receiving a pre-charge signal, a first conduction terminal coupled to a power supply conductor, and a second conduction terminal coupled to the second conduction terminal of the first transistor and the first conduction terminal of the second transistor.

14. The memory circuit of claim 11, wherein the pre-charge voltage circuit comprises:

an inverter having an input that serves as the input of the pre-charge voltage circuit;

a first transistor having a first conduction terminal coupled to an output of the inverter;

a switch having a first terminal commonly coupled to a control terminal and a second conduction terminal of the first transistor, a control terminal for receiving a pre-charge signal, and a second terminal coupled to the input of the inverter; and a second transistor having a first conduction terminal coupled to the input of the inverter, a second conduction terminal coupled to a power supply conductor, and a control terminal for receiving a bias voltage.

15. A method for reading data stored in a bit cell of a memory circuit, comprising the steps of:

sourcing a first current into a bitline of the memory circuit to bias the bitline to a pre-charge voltage;

sourcing a second current into the bitline in response to the pre-charge voltage where the second current is larger than the first current to charge the bitline to a pre-charge value during a pre-charge time;

comparing a reference current with a bit cell current following the pre-charge time where the bit cell current is representative of the data stored in the bit cell; and altering the pre-charge voltage on the bitline based on the comparison between the reference current and the bit cell current to develop a logic state on the bitline representative of the data stored in the bit cell.

16. The method of claim 15, wherein the step of altering the pre-charge voltage on the bitline includes providing a first logic state on the bitline when the reference current is larger than the bit cell current and a second logic state on the bitline when the reference current is less than the bit cell current.

17. The method of claim 15, wherein the step of comparing a reference current with a bit cell current further includes providing the reference current that is relatively independent of a supply voltage.

18. The method of claim 15, wherein the step of sourcing a first current into a bitline of the memory circuit further includes providing the first current that is relatively independent of a supply voltage.

19. The method of claim 15, further including the step of selecting a multiplexer that allows sourcing the first current into the bitline of the memory circuit.

20. The method of claim 19, further including the step of selecting the multiplexer that allows sourcing the second current into the bitline of the memory circuit.

* * * * *